(12) United States Patent
Oh

(10) Patent No.: US 6,891,123 B2
(45) Date of Patent: May 10, 2005

(54) PLASMA IGNITION METHOD AND APPARATUS

(75) Inventor: Sang Hun Oh, Bucheon-si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/749,635

(22) Filed: Dec. 30, 2003

(65) Prior Publication Data

US 2004/0155015 A1 Aug. 12, 2004

(30) Foreign Application Priority Data

Dec. 30, 2002 (KR) ................................ 10-2002-0086801

(51) Int. Cl.[7] .............................................. B23K 10/00
(52) U.S. Cl. ........................... 219/121.43; 219/121.41; 216/67; 204/298.38; 156/345.36
(58) Field of Search ..................... 219/121.4, 121.41, 219/121.43, 121.59, 121.48; 118/723 I, 723 MW; 216/67; 204/298.38, 298.37, 298.21, 298.36; 156/345.36

(56) References Cited

U.S. PATENT DOCUMENTS

| 5,637,153 | A | * | 6/1997 | Niino et al. | ............. 134/22.11 |
|---|---|---|---|---|---|
| 6,291,361 | B1 | * | 9/2001 | Hsia et al. | .................. 438/738 |
| 6,547,978 | B2 | * | 4/2003 | Ye et al. | ....................... 216/75 |
| 6,579,805 | B1 | * | 6/2003 | Bar-Gadda | .................. 438/710 |
| 2001/0055852 | A1 | * | 12/2001 | Moise et al. | ................ 438/396 |

* cited by examiner

Primary Examiner—Mark Paschall
(74) Attorney, Agent, or Firm—Hanley, Flight & Zimmeran, LLC

(57) ABSTRACT

Method and an apparatus for igniting plasma in a semiconductor manufacturing apparatus are disclosed. An example plasma ignition method and apparatus sets a predetermined pressure, source power and bias power of a chamber and flows a predetermined flow rate of $CHF_3$ and Ar gases into the chamber, introduces a predetermined flow rate of $Cl_2$ gas into the chamber, completes the supply of $Cl_2$ gas, and ignites plasma.

17 Claims, 1 Drawing Sheet

PLASMA IGNITION METHOD AND APPARATUS

FIELD OF THE DISCLOSURE

The present disclosure relates generally to semiconductor devices and, more particularly, to a method and an apparatus for igniting plasma in a semiconductor manufacturing apparatus.

BACKGROUND

In general, in semiconductor manufacturing devices, the development of photoresists facilitates the patterning of small-dimensioned electronic and optical devices. An example of such photoresists is deep ultra violet (DUV) photoresists. The dimensions of DUV photoresist patterns are considerably smaller than those of conventional photoresist patterns. A metal etching process requires the formation of metal lines having a space smaller than 0.25 $\mu$m therebetween.

However, since such photoresist is sensitive to the reflectance of the metal lines, the reflectance needs to be reduced in order to form a successful pattern of the photoresist. Therefore, an anti-reflective layer of oxide has been used on the metal lines.

In an in-situ etching of the anti-reflective layer in a metal etching chamber, a gas having fluorine, e.g., $CHF_3$, has been commonly used. However, in the etching process, a process for forming an initial plasma using a gas having fluorine has a certain drawback in that a higher pressure is required to turn on plasma.

Therefore, as shown in Table 1 in conventional plasma ignition processes, a preceding step having a higher pressure than that of a succeeding step is introduced to turn on plasma. Those skilled in the art are able to understand that the values shown in table 1 may vary.

TABLE 1

|  | Pressure (mTorr) | Source power(W) | Bias power(W) | $CHF_3$ flow rate (sccm) | Ar flow rate (sccm) |
|---|---|---|---|---|---|
| Preceding step | 12~20 | 600~1000 | 100~200 | 5~30 | 50~90 |
| Succeeding step | 6~8 | 600~1000 | 100~200 | 5~30 | 50~90 |

However, such conventional processes have a problem in that an error may occur due to a difference in the pressure of a chamber between the preceding step and the succeeding step.

DETAILED DESCRIPTION

Figure 1:
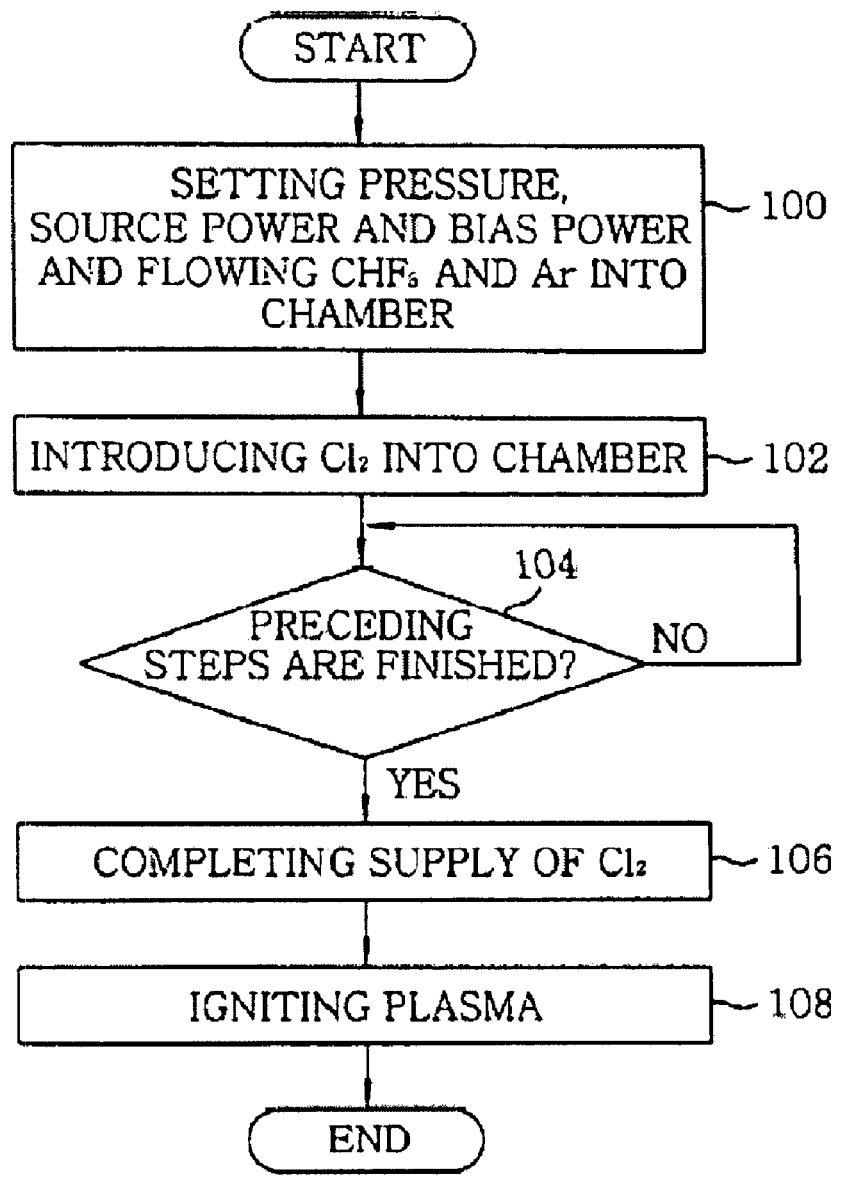
FIG. 1 is a flow chart illustrating an example process for igniting plasma in a semiconductor manufacturing device.

As described in greater detail below, a more stable plasma ignition process in a semiconductor manufacturing device ignites plasma with the use of $Cl_2$ gas while maintaining substantially same pressure of a chamber. One example method sets a predetermined pressure, source power and bias power of a chamber and flowing a predetermined flow rate of $CHF_3$ and Ar gases into the chamber, introduces a predetermined flow rate of $Cl_2$ gas into the chamber, completes the supply of $Cl_2$ gas, and ignites plasma.

In another example a plasma ignition apparatus in a semiconductor manufacturing device includes means for setting a predetermined pressure, source power and bias power of a chamber and flowing a predetermined flow rate of $CHF_3$ and Ar gases into the chamber, means for introducing a predetermined flow rate of $Cl_2$ into the chamber, means for completing the supply of $Cl_2$ gas, and means for igniting plasma.

A plasma process system usually has a chamber in which an item to be processed is located. An inner space of the chamber is maintained in a vacuum state by using a vacuum pump. Then, process gases are introduced into the chamber so that a desired pressure therein may be obtained. Power supplies, i.e., source power and bias power, are connected to operating circuitry functioning inside of the chamber to perform an initial ignition of plasma. During a plasma process, plasma is applied on the item within the chamber, to thereby carry out coating, etching, cleaning, or other processes thereon.

FIG. 1 is a flow chart showing an example process of igniting plasma in a semiconductor manufacturing device. As shown in FIG. 1, a predetermined pressure, source power and bias power in a chamber are set. Then, a predetermined flow rate of $CHF_3$ and Ar gases are introduced into the chamber (block 100). As shown in Table 2, the predetermined pressure preferably ranges about from 6 to 8 mTorr. The predetermined source power and bias power preferably range about from 1 to 10 watts. Further, the $CHF_3$ gas flows into the chamber at a flow rate of about from 0 to 30 standard cubic centimeters per minute (sccm), and the Ar gas about from 0 to 90 sccm. It will be understood by those skilled in the art that the values shown in Table 2 are only examples and may vary.

TABLE 2

|  | Pressure (mTorr) | Source power(W) | Bias power(W) | $Cl_2$ flow rate (sccm) | $CHF_3$ flow rate (sccm) | Ar flow rate (sccm) |
|---|---|---|---|---|---|---|
| Preceding step | 6~8 | 1~10 | 1~10 | 30~150 | 0~30 | 0~90 |
| Succeeding step | 6~8 | 600~1000 | 100~200 | 0 | 0~30 | 0~90 |

Then, a predetermined flow rate of $Cl_2$ gas is introduced into the chamber (block 102). The $Cl_2$ gas flows into the chamber at a flow rate of about from 30 to 150 sccm.

Preferably, it takes about 10 to 15 seconds to complete preceding steps, i.e., the blocks 100 and 102 (block 104), and each of the preceding steps can be processed simultaneously or interchangeably.

Then, the supply of $Cl_2$ gas is completed while maintaining that of other gases, i.e., $CHF_3$ and Ar gases, in the substantially same level as in the preceding steps (block 106). Since $Cl_2$ gas may deteriorate the selectivity of the process requiring high selectivity, the supply of $Cl_2$ gas is prevented.

Thereafter, plasma is ignited or turned on by setting source power and bias power to range about from 600 to 1000 watts and about from 100 to 200 watts, respectively (block 108). During ignition, a little $Cl_2$ gas is used as a residual gas for igniting plasma and then pumped out. At this time, the operations associated with each of the succeeding blocks, i.e., the blocks 106 and 108, may be processed simultaneously or interchangeably.

The pressure of the chamber can be maintained in the substantially same level. Therefore, the aforementioned problem of igniting plasma may be solved by using $Cl_2$ gas without changing the pressure of the chamber. The process of the present invention provides an improved plasma ignition method and apparatus that can be applied at a lower pressure.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A plasma ignition method in a semiconductor manufacturing device, comprising:
   (a) setting a predetermined pressure, source power and bias power of a chamber and flowing a predetermined flow rate of $CHF_3$ and Ar gases into the chamber;
   (b) introducing a predetermined flow rate of $Cl_2$ gas into the chamber;
   (c) completing the supply of $Cl_2$ gas prior to igniting plasma; and
   (d) igniting plasma.

2. The plasma ignition method of claim 1, wherein a pressure of the chamber in is substantially equal to the predetermined pressure.

3. The plasma ignition method of claim 2, wherein the predetermined pressure ranges from about 6 to 8 mTorr.

4. The plasma ignition method of claim 3, wherein the predetermined source power and bias power in the step range from about 1 to 10 watts.

5. The plasma ignition method of claim 4, wherein the predetermined flow rate of Cl2 gas in the step ranges from about 30 to 150 sccm.

6. The plasma ignition method of claim 5, wherein the predetermined flow rate of CHF3 gas and Ar gas range about from 0 to 30 sccm and from about 0 to 90 sccm, respectively.

7. The plasma ignition method of claim 1, wherein (a) and (b) are completed in about 10 to 15 seconds.

8. The plasma ignition method of claim 1, wherein the source power and the bias power are set to range about from 600 to 1000 watts and about from 100 to 200 watts, respectively.

9. A plasma ignition apparatus in a semiconductor manufacturing device, comprising:
   means for setting a predetermined pressure, source power and bias power of a chamber and flowing a predetermined flow rate of $CHF_3$ and Ar gases into the chamber;
   means for introducing a predetermined flow rate of $Cl_2$ into the chamber; means for completing the supply of $Cl_2$ gas prior to igniting plasma; and
   means for igniting plasma.

10. The plasma ignition apparatus of claim 9, wherein a pressure of the chamber is maintained at the predetermined pressure.

11. The plasma ignition apparatus of claim 10, wherein the predetermined pressure ranges about from 6 to 8 mTorr.

12. The plasma ignition apparatus of claim 11, wherein the predetermined source power and bias power range about from 1 to 10 watts.

13. The plasma ignition apparatus of claim 12, wherein the predetermined flow rate of $Cl_2$ gas ranges about from 30 to 150 sccm.

14. The plasma ignition apparatus of claim 13, wherein the predetermined flow rate of $CHF_3$ gas and Ar gas range about from 0 to 30 sccm and about from 0 to 90 sccm, respectively.

15. The plasma ignition apparatus of claim 9, wherein the igniting means includes means for setting source power and bias power to range about from 600 to 1000 watts and about from 100 to 200 watts, respectively.

16. A plasma ignition method in a semiconductor manufacturing device, comprising:
   (a) setting a predetermined pressure, source power and bias power of a chamber and flowing a predetermined flow rate of $CHF_3$ and Ar gases into the chamber;
   (b) introducing a predetermined flow rate of $Cl_2$ gas into the chamber;
   (c) completing the supply of $Cl_2$; and
   (d) igniting plasma using residual $Cl_2$ gas and then pumping the $Cl_2$ gas out of the chamber.

17. A plasma ignition apparatus in a semiconductor manufacturing device, comprising:
   means for setting a predetermined pressure, source power and bias power of a chamber and flowing a predetermined flow rate of $CHF_3$ and Ar gases into the chamber;
   means for introducing a predetermined flow rate of $Cl_2$ into the chamber; means for completing the supply of $Cl_2$; and
   means for igniting plasma using residual $Cl_2$ gas and then pumping the $Cl_2$ gas out of the chamber.

* * * * *